(12) United States Patent
Chen et al.

(10) Patent No.: US 10,745,599 B2
(45) Date of Patent: Aug. 18, 2020

(54) POLYPHENYL ETHER RESIN COMPOSITION AND USE THEREOF IN HIGH-FREQUENCY CIRCUIT SUBSTRATE

(71) Applicant: Shengyi Technology Co., Ltd., Guangdong (CN)

(72) Inventors: Guangbing Chen, Guangdong (CN); Xianping Zeng, Guangdong (CN); Chiji Guan, Guangdong (CN)

(73) Assignee: Shengyi Technology Co., Ltd., Guangdong (CN)

( * ) Notice: Subject to any disclaimer, the term of this patent is extended or adjusted under 35 U.S.C. 154(b) by 109 days.

(21) Appl. No.: 15/744,446

(22) PCT Filed: Mar. 2, 2016

(86) PCT No.: PCT/CN2016/075322
§ 371 (c)(1),
(2) Date: Jan. 12, 2018

(87) PCT Pub. No.: WO2017/067123
PCT Pub. Date: Apr. 27, 2017

(65) Prior Publication Data
US 2018/0215971 A1  Aug. 2, 2018

(30) Foreign Application Priority Data

Oct. 21, 2015 (CN) .......................... 2015 1 0689858

(51) Int. Cl.
| | |
|---|---|
| C09J 171/12 | (2006.01) |
| C08L 71/12 | (2006.01) |
| H05K 1/03 | (2006.01) |
| C08J 5/24 | (2006.01) |
| C09J 11/04 | (2006.01) |
| C09J 11/06 | (2006.01) |
| C08G 77/20 | (2006.01) |
| C08G 65/48 | (2006.01) |
| H05K 1/02 | (2006.01) |

(52) U.S. Cl.
CPC .............. *C09J 171/12* (2013.01); *C08J 5/24* (2013.01); *C08L 71/126* (2013.01); *C09J 11/04* (2013.01); *C09J 11/06* (2013.01); *H05K 1/0353* (2013.01); C08G 65/485 (2013.01); C08G 77/20 (2013.01); C08J 2371/12 (2013.01); C08J 2483/07 (2013.01); H05K 1/0237 (2013.01); H05K 1/0366 (2013.01); H05K 1/0373 (2013.01); H05K 2201/012 (2013.01); H05K 2201/0162 (2013.01)

(58) Field of Classification Search
CPC . C09J 171/12; C09J 11/04; C09J 11/06; C08J 5/24; C08J 2371/12; C08J 2483/07; H05K 2201/012; H05K 1/0237; H05K 1/0373
USPC .......................................................... 524/94
See application file for complete search history.

(56) References Cited

U.S. PATENT DOCUMENTS

2015/0313012 A1* 10/2015 Chen ......................... C08J 5/24
442/117

FOREIGN PATENT DOCUMENTS

| CN | 1487977 A | 4/2004 |
|---|---|---|
| CN | 1788040 A | 6/2006 |
| CN | 101278011 A | 10/2008 |
| CN | 102234427 A | 11/2011 |
| CN | 102993683 A | 3/2013 |
| CN | 104650574 A | 5/2015 |
| EP | 2927281 A1 | 10/2015 |
| JP | 2003012820 A * | 1/2003 |
| JP | 2003012820 A | 1/2003 |
| JP | 2006516297 A | 6/2006 |
| JP | 2013082835 A | 5/2013 |

OTHER PUBLICATIONS

Translation of JP 2003-012820 (Patent application 2001-197162), Jan. 15, 2003. (Year: 2003).*
International Search Report issued in PCT/CN2016/075322 dated Jun. 14, 2016.

* cited by examiner

*Primary Examiner* — Hui H Chin
(74) *Attorney, Agent, or Firm* — Norton Rose Fulbright US LLP; James R. Crawford

(57) ABSTRACT

The present invention relates to a polyphenyl ether resin composition and a use thereof in a high-frequency circuit substrate. The polyphenyl ether resin composition comprises a vinyl-modified polyphenyl ether resin and an organic silicon resin containing unsaturated double bonds and having a three-dimensional net structure. The high-frequency circuit substrate of the present invention has a high glass-transition temperature, a high thermal decomposition temperature, a high interlayer adhesive force, a low dielectric constant and a low dielectric loss tangent, and is very suitable as a circuit substrate of high-speed electronic equipment.

21 Claims, 1 Drawing Sheet

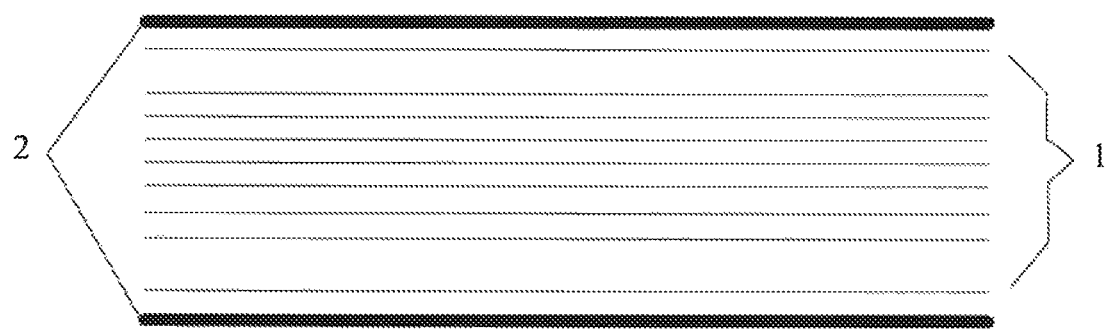

POLYPHENYL ETHER RESIN COMPOSITION AND USE THEREOF IN HIGH-FREQUENCY CIRCUIT SUBSTRATE

CROSS REFERENCE TO RELATED APPLICATIONS

This application is a § 371 of International Application No. PCT/CN2016/075322 filed Mar. 2, 2016, and claims priority from Chinese Patent Application No. 201510689858.8 filed Oct. 21, 2015.

TECHNICAL FIELD

The present invention relates to a polyphenylene ether resin composition. In particular, the present invention relates to a polyphenylene ether resin composition and a use thereof in a high-frequency circuit substrate.

BACKGROUND ART

In recent years, with the development of electronic information technology, the miniaturization and densification of electronic device installation and high volume and frequency of information, there is a higher demand for overall properties of the circuit substrate including heat resistance, water absorption, chemical resistance, mechanical properties, dimensional stability, dielectric constant and dielectric loss, etc.

In terms of dielectric constant property, the relationship between signal transmission rate and dielectric constant Dk of insulating material in high-speed circuit is that: the lower the dielectric constant Dk of insulating material is, the faster the signal transmission rate is. Therefore, in order to achieve high frequency of signal transmission rate, substrates having low dielectric constant must be developed. As the signal frequency becomes high, the loss of signal in the substrate can no longer be ignored. The relationship among signal loss and frequency, dielectric constant Dk and dielectric loss Df is that: the smaller the dielectric constant Dk of a substrate is, and the smaller the dielectric loss Df is, the smaller the signal loss is. Therefore, the development of a high-frequency circuit substrate having low dielectric constant Dk, low dielectric loss Df and good heat resistance becomes a research direction commonly focused by CCL manufacturers.

Polyphenylene ether resin contains a large number of benzene ring structures in its molecular structure, and no strong polar group, giving excellent performances to polyphenylene ether resin, such as high glass transition temperature, good dimensional stability, low linear expansion coefficient and low water absorption, especially excellent low dielectric constant and low dielectric loss. However, as a thermoplastic resin, polyphenylene ether has disadvantages of high melting point, poor processability, poor solvent resistance and others. Since polyphenylene ether has excellent physical properties, heat resistance, chemical properties and electrical properties, etc., major companies in the world are attracted to modify it and have made some achievements. For example, a reactive group (such as vinyl group) is introduced to the end or side of the chain of the polyphenylene ether molecule to make it become a thermosetting resin. The resin has excellent overall properties of heat resistance, low dielectric constant and low dielectric loss and others after curing, and becomes an ideal material for the preparation of high-frequency circuit substrate.

An organosilicon compound containing unsaturated double bonds is used as a crosslinking agent for vinyl active group-modified thermosetting polyphenylene ether to prepare a high-frequency electronic circuit substrate.

CN 102993683 utilizes an organosilicon compound containing unsaturated double bonds as a crosslinking agent for modified polyphenylene ether. The prepared high-frequency circuit substrate has high glass transition temperature, high thermal decomposition temperature, high interlayer adhesive force, low dielectric constant and low dielectric loss. However, the organosilicon compound containing unsaturated double bonds adopted in this prior art has a structure of linear or cyclic organosilicon compound. The linear organosilicon compound containing unsaturated double bonds has good flexibility, and the high-frequency circuit substrate prepared therefrom has low bending strength. The prepared high-frequency circuit substrate by use of cyclic organosilicon compound containing unsaturated double bonds has good overall properties, but there is a problem of volatilization during the sizing and baking process due to its small molecular weight.

CN104650574A utilizes a composition comprising polyphenylene ether, polyperfluoroethylene emulsion, organosilicon resin and inorganic filler to prepare a high-frequency electronic circuit substrate. The prepared substrate has advantages of low dielectric constant, low dielectric loss, good processability and the like. However, the organosilicon resin used in this prior art is methylphenyl DQ organosilicon resin, which does not contain active groups and cannot be used as a crosslinking agent for vinyl-modified thermosetting polyphenylene ether.

CONTENTS OF THE INVENTION

In view of the problems existing in the prior art, the first object of the present invention is to provide a polyphenylene ether resin composition having low dielectric constant Dk, low dielectric loss Df, as well as excellent heat resistance and interlayer adhesive force, which meets the requirements of the high-frequency circuit substrate on properties of dielectric constant, dielectric loss, heat resistance, adhesive force and others and can be used for the preparation of high-frequency circuit substrate.

In order to achieve the above purpose, the present invention utilizes the following technical solution.

A polyphenylene ether resin composition, comprising a vinyl-modified polyphenylene ether resin and an organosilicon resin containing unsaturated double bonds and having a three-dimensional network structure. The organosilicon resin containing unsaturated double bonds and having a three-dimensional network structure is any one selected from the group consisting of TT organosilicon resin containing unsaturated double bonds and having a three-dimensional network structure and formed by hydrolytic condensation of trifunctional siloxane unit (T unit), and TQ organosilicon resin containing unsaturated double bonds and having a three-dimensional network structure and formed by hydrolytic condensation of trifunctional siloxane unit (T unit) and tetrafunctional siloxane unit (Q unit), or a mixture of two of them.

The vinyl-modified polyphenylene ether resin is a powdery solid thermosetting resin at room temperature, which contains active unsaturated double bonds at the two ends and can conduct a radical polymerization curing in the presence of a curing initiator to produce a thermosetting resin that has excellent overall properties such as heat resistance, dimensional stability, low water absorption, low dielectric constant and low dielectric loss, etc.

When the organosilicon resin containing unsaturated double bonds and having a three-dimensional network structure is used as a crosslinking agent for the vinyl-modified polyphenylene ether, the crosslinking density of the polyphenylene ether resin composition is high after curing, which can provide a high glass transition temperature for the high-frequency circuit substrate. Meanwhile, the organosilicon resin containing unsaturated double bonds and having a three-dimensional network structure does not contain polar groups, which can guarantee low water absorption, low dielectric constant and low dielectric loss of the high-frequency circuit substrate. The organosilicon resin containing unsaturated double bonds and having a three-dimensional network structure has high thermal decomposition temperature, which can provide excellent heat resistance for the high-frequency circuit substrate. In addition, the prepared high-frequency circuit substrate has high interlayer adhesive force and bending strength, which can improve the reliability of the substrate.

The vinyl-modified polyphenylene ether resin has excellent properties such as low dielectric constant and low dielectric loss. When the organosilicon resin containing unsaturated double bonds and having a three-dimensional network structure is used as the crosslinking agent for the modified polyphenylene ether resin, the prepared high-frequency circuit substrate has excellent overall properties such as low dielectric constant, low dielectric loss, low water absorption, high heat resistance, high interlayer adhesive force and high bending strength. Compared to using linear organosilicon compound containing unsaturated double bonds as the crosslinking agent, the substrate has higher bending strength. Compared to cyclic organosilicon compound containing unsaturated double bonds as the crosslinking agent, the organosilicon resin containing unsaturated double bonds and having a three-dimensional network structure does not have a problem of volatilization during the sizing and baking process.

Preferably, the vinyl-modified polyphenylene ether resin has the following structure:

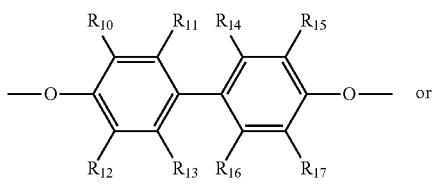

wherein $0 \leq x \leq 100$, $0 \leq y \leq 100$, $2 \leq x+y \leq 100$. For example, $15 \leq x+y \leq 30$, $25 \leq x+y \leq 40$, $30 \leq x+y \leq 55$, $60 \leq x+y \leq 85$, $80 \leq x+y \leq 98$, $10 \leq x+y \leq 20$, $35 \leq x+y \leq 45$, $65 \leq x+y \leq 75$, $85 \leq x+y \leq 95$, etc.

M is selected from:

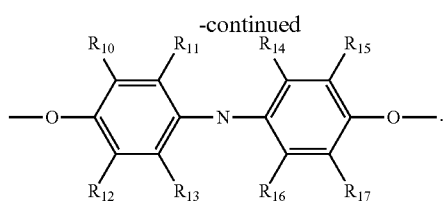 or

-continued

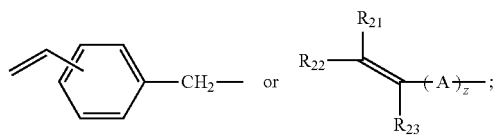

N is any one selected from the group consisting of —O—, —CO—, —SO—, —SC—, —SO$_2$— and —C(CH$_3$)$_2$—, or a mixture of at least two of them.

$R_2$, $R_4$, $R_6$, $R_8$, $R_{11}$, $R_{13}$, $R_{15}$ and $R_{17}$ are each any one independently selected from the group consisting of substituted or unsubstituted C1-C8 (for example C2, C3, C4, C5, C6 or C7) linear alkyl, substituted or unsubstituted C1-C8 (for example C2, C3, C4, C5, C6 or C7) branched alkyl, and substituted or unsubstituted phenyl, or a combination of at least two of them.

$R_1$, $R_3$, $R_5$, $R_7$, $R_{10}$, $R_{12}$, $R_{14}$ and $R_{16}$ are each any one independently selected from the group consisting of hydrogen atom, substituted or unsubstituted C1-C8 (for example C2, C3, C4, C5, C6 or C7) linear alkyl, substituted or unsubstituted C1-C8 (for example C2, C3, C4, C5, C6 or C7) branched alkyl, and substituted or unsubstituted phenyl, or a combination of at least two of them.

$R_9$ is selected from

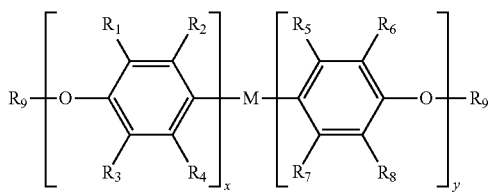

wherein A is arylene, carbonyl, or alkylene having 1-10 (for example 2, 3, 4, 5, 6, 7, 8 or 9) carbon atoms; Z is an integer of 0-10, for example 0, 1, 2, 3, 4, 5, 6, 7, 8, 9 or 10; $R_{21}$, $R_{22}$ and $R_{23}$ are each independently selected from hydrogen atom or alkyl having 1-10 (for example 2, 3, 4, 5, 6, 7, 8 or 9) carbon atoms.

Preferably, the vinyl-modified polyphenylene ether resin has a number average molecular weight of 500-10,000 g/mol, preferably 800-8,000 g/mol, more preferably 1,000-4,000 g/mol.

Preferably, the TT organosilicon resin containing unsaturated double bonds and having a three-dimensional network structure and formed by hydrolytic condensation of trifunctional siloxane unit (T unit) has the following structure:

$(R_{24}SiO_{3/2})_{x1}$ wherein $6 \leq x1 \leq 10$, for example 6, 7, 8, 9 or 10;
$R_{24}$ is selected from substituted or unsubstituted C2-C10 (for example C2, C3, C4, C5, C6, C7, C8 or C9) C=C-containing groups.

Preferably, the TQ organosilicon resin containing unsaturated double bonds and having a three-dimensional network structure and formed by hydrolytic condensation of trifunctional siloxane unit (T unit) and tetrafunctional siloxane unit (Q unit) has the following structure:

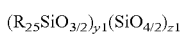
$(R_{25}SiO_{3/2})_{y1}(SiO_{4/2})_{z1}$ wherein $4 \leq y1 \leq 100$, for example 5, 10, 15, 20, 25, 30, 35, 40, 45, 50, 55, 60, 65, 70, 75, 80, 85, 90 or 95, $1 \leq z1 \leq 100$, for example 5, 10, 15, 20, 25, 30, 35, 40, 45, 50, 55, 60, 65, 70, 75, 80, 85, 90 or 95, and $4 \leq y1/z1 \leq 10$, for example 5, 6, 7, 8, 9 or 10;

$R_{25}$ is selected from substituted or unsubstituted C2-C10 (for example C2, C3, C4, C5, C6, C7, C8 or C9) C=C-containing groups.

In the present invention, preferably, the weight of the organosilicon resin containing unsaturated double bonds and having a three-dimensional network structure is 10-90 parts by weight, for example 15 parts by weight, 20 parts by weight, 25 parts by weight, 30 parts by weight, 35 parts by weight, 40 parts by weight, 45 parts by weight, 50 parts by weight, 55 parts by weight, 60 parts by weight, 65 parts by weight, 70 parts by weight, 75 parts by weight, 80 parts by weight or 85 parts by weight, preferably 25-90 parts by weight, based on 100 parts by weight of the vinyl-modified polyphenylene ether resin. By selecting the above preferable range, the resin system will have a better glass transition temperature after curing and crosslinking.

Preferably, the polyphenylene ether resin composition of the present invention further comprises a free radical initiator. The free radical initiator plays a role in initiating the polymerization, crosslinking, and curing of the resin system. Upon heating, the free radical initiator decomposes to generate radicals, which initiate the crosslinking among the active groups of the resin system to form a crosslinked networkwork structure with a spatial three dimensional structure.

Preferably, based on 100 parts by weight of the total weight of the vinyl-modified polyphenylene ether resin and the organosilicon resin containing unsaturated double bonds and having a three-dimensional network structure, the weight of the free radical initiator is 1-3 parts by weight.

For example, the weight of the free radical initiator is 1.2 parts by weight, 1.4 parts by weight, 1.6 parts by weight, 1.8 parts by weight, 2.0 parts by weight, 2.2 parts by weight, 2.4 parts by weight, 2.6 parts by weight, 2.8 parts by weight or 2.9 parts by weight. By selecting the content of the free radical initiator described in the present invention, an appropriate reaction rate can be obtained in the curing process, and excellent curing property can be obtained in the curing process when preparing a prepreg or a high-frequency circuit substrate.

Preferably, the free radical initiator is selected from organic peroxide initiators, and further preferably any one selected from the group consisting of dicumyl peroxide, dibenzoyl peroxide, benzoyl peroxide, tert-butyl peroxybenzoate and butyl 4,4-di(tert-butylperoxy)valerate, or a mixture of at least two of them. Said mixture is, for example, a mixture of butyl 4,4-di(tert-butylperoxy)valerate and tert-butyl peroxybenzoate, a mixture of dibenzoyl peroxide and dicumyl peroxide, a mixture of butyl 4,4-di(tert-butylperoxy)valerate and dibenzoyl peroxide, a mixture of tert-butyl peroxybenzoate and dicumyl peroxide, a mixture of butyl 4,4-di(tert-butylperoxy)valerate, tert-butyl peroxybenzoate and dibenzoyl peroxide. The free radical initiators can be used alone or in combination, and a better synergistic effect can be achieved when used in combination.

Preferably, the polyphenylene ether resin composition of the present invention further comprises a flame retardant.

Preferably, based on 100 parts by weight of the total weight of the vinyl-modified polyphenylene ether resin and the organosilicon resin containing unsaturated double bonds and having a three-dimensional network structure, the weight of the flame retardant is 0-40 parts by weight, preferably 0-40 parts by weight excluding 0. For example, the weight of the flame retardant is 1 parts by weight, 3 parts by weight, 7 parts by weight, 11 parts by weight, 15 parts by weight, 19 parts by weight, 23 parts by weight, 27 parts by weight, 31 parts by weight, 35 parts by weight, 38 parts by weight or 39 parts by weight. 0 parts by weight of the flame retardant means that there is no flame retardant in the resin composition. The heat resistance and the interlayer adhesive force will be reduced if the content of the flame retardant is too high.

Preferably, the flame retardant of the present invention is any one selected from the group consisting of halogenated flame retardant, phosphorus flame retardant, and nitrogen flame retardant, or a mixture of at least two of them, and preferably any one selected from the group consisting of brominated flame retardant, phosphorus flame retardant and nitrogen flame retardant, or a mixture of at least two of them.

Preferably, the brominated flame retardant is any one selected from the group consisting of decabromodiphenyl oxide, hexabromobenzene, decabromodiphenyl ethane, and ethylene bis(tetrabromophthalimide), or a mixture of at least two of them. Said mixture is, for example, a mixture of decabromodiphenyl ethane and hexabromobenzene, a mixture of decabromodiphenyl oxide and ethylene bis(tetrabromophthalimide), a mixture of decabromodiphenyl ethane, hexabromobenzene and decabromodiphenyl oxide, and a mixture of ethylene bis(tetrabromophthalimide), decabromodiphenyl ethane, hexabromobenzene and decabromodiphenyl oxide.

Preferably, the phosphorus flame retardant is any one selected from the group consisting of tris(2,6-dimethylphenyl)phosphine, 10-(2,5-dihydroxyphenyl)-9,10-dihydro-9-oxa-10-phosphaphenanthrene-10-oxide, 2,6-bis(2,6-dimethylphenyl)phosphinobenzene and 10-phenyl-9,10-dihydro-9-oxa-10-phosphaphenanthrene-10-oxide, or a mixture of at least two of them. Said mixture is, for example, a mixture of 10-phenyl-9,10-dihydro-9-oxa-10-phosphaphenanthrene-10-oxide and 2,6-bis(2,6-dimethylphenyl)phosphinobenzene, a mixture of 10-(2,5-dihydroxyphenyl)-9,10-dihydro-9-oxa-10-phosphaphenanthrene-10-oxide and tris(2,6-dimethylphenyl)phosphine, a mixture of 10-phenyl-9,10-dihydro-9-oxa-10-phosphaphenanthrene-10-oxide, 2,6-bis(2,6-dimethylphenyl)phosphinobenzene and 10-(2,5-dihydroxyphenyl)-9,10-dihydro-9-oxa-10-phosphaphenanthrene-10-oxide, and a mixture of tris(2,6-dimethylphenyl)phosphine, 10-phenyl-9,10-dihydro-9-oxa-10-phosphaphenanthrene-10-oxide and 2,6-bis(2,6-dimethylphenyl)phosphinobenzene.

Preferably, the nitrogen flame retardant is any one selected from the group consisting of melamine, melamine phosphate, guanidine phosphate, guanidine carbonate, and guanidine sulfamate, or a mixture of at least two of them. Said mixture is, for example, a mixture of guanidine sulfamate and guanidine carbonate, a mixture of guanidine phosphate and melamine phosphate, a mixture of melamine and guanidine sulfamate, a mixture of guanidine carbonate, guanidine phosphate and melamine, and a mixture of melamine phosphate, guanidine sulfamate, melamine and guanidine phosphate, preferably melamine or/and melamine phosphate.

Preferably, the polyphenylene ether resin composition of the present invention further comprises a powder filler. Preferably, the powder filler is any one selected from the group consisting of crystalline silica, amorphous silica, spherical silica, fused silica, titania, silicon carbide, glass fiber, alumina, aluminum nitride, boron nitride, barium titanate and strontium titanate, or a mixture of at least two of them. Said mixture is, for example, a mixture of crystalline silica and amorphous silica, a mixture of spherical silica and titania, a mixture of silicon carbide and glass fiber, a mixture of alumina and aluminum nitride, a mixture of boron nitride and barium titanate, a mixture of strontium titanate and silicon carbide, and a mixture of spherical silica, crystalline silica and amorphous silica.

In the polyphenylene ether resin composition of the present invention, the powder filler plays a role in improving dimensional stability, lowering coefficient of thermal expansion, and reducing cost of the system and so on. The present invention does not restrict the shape and diameter of the powder filler. The normally used powder fillers have a particle size of 0.2-10 μm, for example, 0.5 μm, 1 μm, 2 μm, 3 μm, 5 μm, 8 μm, or 9 μm. For example, spherical silica having a particle size of 0.2-10 μm can be selected.

Preferably, the weight of the powder filler is 0-150 parts by weight, preferably 0-150 parts by weight excluding 0, based on 100 parts by weight of the total weight of the vinyl-modified polyphenylene ether resin, the organosilicon resin containing unsaturated double bonds and having a three-dimensional network structure and the flame retardant.

For example, the weight of the powder filler is 5 parts by weight, 15 parts by weight, 25 parts by weight, 35 parts by weight, 45 parts by weight, 55 parts by weight, 75 parts by weight, 90 parts by weight, 100 parts by weight, 110 parts by weight, 120 parts by weight, 130 parts by weight, 140 parts by weight or 145 parts by weight. 0 parts by weight of the powder filler means that there is no powder filler in the resin composition.

The terms "comprise(s)", "comprising", "include(s)", "including" as used herein mean that, in addition to the described components, other components which impart different properties to the resin composition may be included. In addition, the terms "comprise(s)", "comprising", "include(s)", "including" described in the present invention may also be replaced by closed "is/are" or "consisting of/consist(s) of".

For example, the polyphenylene ether resin composition of the present invention may comprise a thermosetting resin, for example, epoxy resin, cyanate ester resin, phenolic resin, polyurethane resin, melamine resin, etc., and the curing agent and/or curing accelerator of these thermosetting resin may be also added.

Further, the polyphenylene ether resin composition may further comprise various additives, for example, silane coupling agent, titanate coupling agent, antioxidant, heat stabilizer, antistatic agent, ultraviolet absorber, pigment, colorant and lubricant, etc. These thermosetting resins and various additives can be used alone, or used in a combination of two or more thereof.

The resin composition of the present invention may be prepared by compounding, stirring and mixing of the vinyl-modified polyphenylene ether resin, organosilicon resin containing unsaturated double bonds and having a three-dimensional network structure, free radical initiator, flame retardant, powder filler, various thermosetting resins and various additives according to a well-known method.

The second object of the present invention is to provide a resin glue solution, which is obtained by dissolving or dispersing the polyphenylene ether resin composition described above in a solvent.

The solvent in the present invention has no particular restrictions, and specific examples thereof include alcohols such as methanol, ethanol and butanol; ethers such as ethyl cellosolve, butyl cellosolve, ethylene glycol-methyl ether, carbitol and butyl carbitol; ketones such as acetone, butanone, methyl ethyl ketone, methyl isobutyl ketone and cyclohexanone; aromatic hydrocarbons such as toluene, xylene and mesitylene; esters such as ethoxyethyl acetate and ethyl acetate; nitrogen-containing solvents such as N,N-dimethylformamide, N,N-dimethylacetamide and N-methyl-2-pyrrolidone. These solvents can be used alone or used in a combination of two or more thereof, and preferably, in a combination of aromatic hydrocarbon solvents such as toluene, xylene and mesitylene and ketone solvents such as acetone, butanone, methyl ethyl ketone, methyl isobutyl ketone and cyclohexanone. The usage amount of the solvent can be selected by those skilled in the art according to their experience for the purpose of getting proper viscosity of the resin glue solution which is suitable for use.

During the dissolving and dispersing process of the above resin composition in the solvent, an emulsifier may be added. The powder filler and others may be dispersed evenly in the glue solution through dispersing by means of the emulsifier.

The third object of the present invention is to provide a prepreg, which is prepared by impregnating a reinforcing material such as a glass fiber cloth with the above resin glue solution and then drying it.

In the present invention, the glass fiber cloth is a reinforcing material, which improves strength, improves dimensional stability and reduces shrinkage of the thermosetting resin when curing.

Different types of glass fiber cloth may be chosen depending on the different requirements such as the thickness of the plate. Specific examples of the glass fiber cloth include 7628 glass fiber cloth and 2116 glass fiber cloth.

Preferably, based on 100 parts by weight of the total weight of the vinyl-modified polyphenylene ether resin, the organosilicon resin containing unsaturated double bonds and having a three-dimensional network structure, the flame retardant and the powder filler, the weight of the reinforcing material such as a glass fiber cloth is 50-230 parts by weight, for example, 70 parts by weight, 90 parts by weight, 110 parts by weight, 150 parts by weight, 180 parts by weight, 200 parts by weight, 210 parts by weight or 220 parts by weight.

The drying temperature is 80-220° C., for example 90C, 110° C., 150° C., 170° C., 190° C. or 200° C. The drying time is 1-30 min, for example 5 min, 8 min, 13 min, 17 min, 21 min, 24 min or 28 min.

The fourth object of the present invention is to provide a high-frequency circuit substrate prepared from the prepreg as described above.

Exemplary method for preparing the high-frequency circuit substrate comprises: overlapping at least one sheet of the above prepregs, placing copper foils on the upper and lower sides of the overlapped prepregs, and then laminate molding them. A high-frequency circuit substrate having low dielectric constant property, low dielectric loss, high heat resistance, low water absorption, high interlayer adhesive force, and high bending strength can be prepared by using the method of the present invention.

Preferably, automatic stacking operation is used for the overlapping process to simplify the technical operation.

Preferably, the laminate molding uses vacuum laminate molding, which can be achieved by a vacuum laminator. The lamination time is 70-120 min, for example 75 min, 80 min, 85 min, 90 min, 95 min, 100 min, 105 min, 110 min, or 115 min. The lamination temperature is 180-220° C., for example 185C, 190° C., 195° C., 200° C., 205° C., 210° C. or 215° C. The lamination pressure is 40-60 kg/cm$^2$, for example 45 kg/cm$^2$, 50 kg/cm$^2$, 55 kg/cm$^2$ or 58 kg/cm$^2$.

A typical but non-limiting preparation method of the high-frequency circuit substrate of the present invention is as follows:

(1) Each ingredient is weighed according to the formula of the above resin composition: based on 100 parts by weight of the vinyl-modified polyphenylene ether resin, the weight of the organosilicon resin containing unsaturated double bonds and having a three-dimensional network structure is 10-90 parts by weight; based on 100 parts by weight of the total weight of the vinyl-modified polyphenylene ether resin and the organosilicon resin containing unsaturated double bonds and having a three-dimensional network structure, the weight of the free radical initiator is 1-3 parts by weight, and the weight of the flame retardant is 0-40 parts by weight; based on 100 parts by weight of the total weight of the vinyl-modified polyphenylene ether resin, the organosilicon resin containing unsaturated double bonds and having a three-dimensional network structure and the flame retardant, the weight of the powder filler is 0-150 parts by weight;

(2) The vinyl-modified polyphenylene ether resin, organosilicon resin containing unsaturated double bonds and having a three-dimensional network structure, free radical initiator, powder filler and flame retardant are mixed, and then an appropriate amount of a solvent is added. The mixture is stirred for even dispersion, so that the powder filler and flame retardant are uniformly dispersed in the resin glue solution. A reinforcing material such as a glass fiber cloth is impregnated with the prepared glue solution, and then dried by heating to get rid of the solvent to get a prepreg;

(3) At least one sheet of the above prepregs is/are overlapped, and copper foils are placed on both sides of the prepregs, and then they were laminated and cured in a vacuum laminator to get a high-frequency circuit substrate.

In the present invention, "high-frequency" means that the frequency is higher than 1 MHz.

Compared with the prior art, the present invention has the following advantages:

(1) By using the organosilicon resin containing unsaturated double bonds and having a three-dimensional network structure as a crosslinking agent for the vinyl-modified polyphenylene ether, the resin composition has a high crosslinking density after curing, which can provide a high glass transition temperature for the high-frequency circuit substrate;

(2) The organosilicon resin containing unsaturated double bonds and having a three-dimensional network structure does not contain polar groups, which can guarantee low water absorption, low dielectric constant and dielectric loss for the high-frequency circuit substrate;

(3) The organosilicon resin containing unsaturated double bonds and having a three-dimensional network structure has high thermal decomposition temperature, which can provide excellent heat resistance for the high-frequency circuit substrate;

(4) By using the organosilicon resin containing unsaturated double bonds and having a three-dimensional network structure as a crosslinking agent for the vinyl-modified polyphenylene ether, the prepared high-frequency circuit substrate has high interlayer adhesive force and high bending strength, which can improve the reliability of the substrate;

(5) The organosilicon resin containing unsaturated double bonds and having a three-dimensional network structure is not volatile, and thus does not have a problem of volatilization during the sizing and baking process.

In brief, the high-frequency circuit substrate prepared by using the vinyl-modified polyphenylene ether resin and organosilicon compound containing unsaturated double bonds and having a three-dimensional network structure has high glass transition temperature ($\geq 180°$ C.), good heat resistance (thermal decomposition temperature $\geq 430°$ C.), low water absorption (water absorption $\leq 0.08\%$), high interlayer adhesive force ($\geq 1$ N/mm), high bending strength ($\geq 450$ MPa), low dielectric constant (10 GHz, $\leq 3.85$) and low dielectric loss (10 GHz, $\leq 0.0070$), and thus is very suitable for preparing circuit substrates of high-frequency electronic devices.

BRIEF DESCRIPTION OF THE DRAWINGS

The technical solutions of the present invention are further explained below by specific embodiments in combination with the drawing.

FIG. 1 shows a schematic diagram of the high-frequency circuit substrate according to the present invention.

Reference numbers in the drawing of the present specification are as follows:
1—prepreg; 2—copper foil.

EMBODIMENTS

To better illustrate the present invention and facilitate understanding of the technical solutions of the present invention, typical but non-limiting examples of the present invention are shown as follows.

FIG. 1 is a schematic diagram of the high-frequency circuit substrate according to the present invention, wherein "2" represents a copper foil, and the copper foil is preferably high peeling inverted copper foil, low profile copper foil and ultra-low profile copper foil. In the FIGURE, the number of prepregs is nine. In the practice, the number of prepregs, the type of glass fiber cloth, and the weight fraction of the glass fiber cloth and the resin composition are decided by the requirements such as the thickness of the high-frequency circuit substrate for actual applications.

Preparation Example 1

A mixture of concentrated hydrochloric acid, deionized water and ethanol was added into a three-necked flask, and a mechanical stirrer was started, and then triethyl vinylsilicate was added dropwise rapidly under rapid stirring and heating reflux for hydrolytic condensation. After hydrolysis for a certain period of time, toluene was added for extraction, and then the reaction solution was poured into a separatory funnel and allowed to stand for delamination. The water layer was removed, and the oil layer was washed with water until being neutral, and the solvent toluene was removed by distilling and drying, and then a vinyl TT organosilicon resin V-1 containing unsaturated double bonds and having a three-dimensional network structure and formed by hydrolytic condensation of trifunctional vinyl-containing siloxane unit (T unit) was obtained. The vinyl TT organosilicon resin V-1 has a molecular weight Mn of 2000.

Preparation Example 2

A mixture of concentrated hydrochloric acid, deionized water and ethanol was added into a three-necked flask, and a mechanical stirrer was started, and then triethyl vinylsilicate and tetraethyl orthosilicate were added dropwise rapidly under rapid stirring and heating reflux for hydrolytic condensation. After hydrolysis for a certain period of time, toluene was added for extraction, and then the reaction solution was poured into a separatory funnel and allowed to stand for delamination. The water layer was removed, and the oil layer was washed with water until being neutral, and the solvent toluene was removed by distilling and drying, and then a vinyl TQ organosilicon resin V-2 containing unsaturated double bonds and having a three-dimensional network structure and formed by hydrolytic condensation of trifunctional vinyl-containing siloxane unit (T unit) and tetrafunctional siloxane unit (Q unit) was obtained. The vinyl TQ organosilicon resin V-2 has a molecular weight Mn of 1900.

Preparation Example 3

A mixture of concentrated hydrochloric acid, deionized water and ethanol was added into a three-necked flask, and a mechanical stirrer was started, and then triethyl phenylsilicate and dimethyldiethoxyl silane were added dropwise rapidly under rapid stirring and heating reflux for hydrolytic condensation. After hydrolysis for a certain period of time, toluene was added for extraction, and then the reaction solution was poured into a separatory funnel and allowed to stand for delamination. The water layer was removed, and the oil layer was washed with water until being neutral, and the solvent toluene was removed by distilling and drying, and then a methylvinyl DT organosilicon resin V-00 containing unsaturated double bonds and having a three-dimensional network structure and formed by hydrolytic condensation of difunctional methyl-containing siloxane unit (D unit) and trifunctional phenyl-containing siloxane unit (T unit) was obtained. The methylvinyl DT organosilicon resin V-00 has a molecular weight Mn of 2000.

To better illustrate the present invention and facilitate understanding of the technical solutions of the present invention, typical but non-limiting examples of the present invention are shown as follows.

Raw materials used in Examples and Comparative Examples are shown in Table 1,

TABLE 1

Raw materials used in Examples and Comparative Examples

| Manufacturers | Product names or trademarks | Descriptions for Materials |
|---|---|---|
| Sabic | SA9000 | Methacrylate-modified polyphenylene ether resin |
| Mitsubishi Chemical Corporation | St-PPE-1 | Vinylbenzylether-modified polyphenylene ether resin |
| Runhe Chemical | RH-Vi306 | Linear organosilicon compound containing unsaturated double bonds |
| WD Silicone | WD-V4 | Cyclic organosilicon compound containing unsaturated double bonds |
| Self-made | V-00 | Methylphenyl DT organosilicon resin |
| Self-made | V-1 | Vinyl TT organosilicon resin |
| Self-made | V-2 | Vinyl TQ organosilicon resin |
| Shanghai Gaoqiao | DCP | Dicumyl peroxide |
| Dongguan Xinwei Chemical | BPO | Dibenzoyl peroxide |
| Sibelco | 525 | Fused silica |
| Albemarle, U.S. | XP-7866 | Phosphorus flame retardant |
| Albemarle, U.S. | XP-7866 | Phosphorus flame retardant |
| Shanghai Honghe | 2116 | Glass fiber cloth |

Example 1

100.0 parts by weight of methacrylate-modified polyphenylene ether resin powder SA9000, 10.0 parts by weight of vinylphenyl TT organosilicon resin V-1 containing unsaturated double bonds and having a three-dimensional network structure and formed by hydrolytic condensation of trifunctional vinyl-containing siloxane unit (T unit) and 3.0 parts by weight of a free radical initiator dicumyl peroxide (DCP) were dissolved in a toluene solvent and the solution was adjusted to a suitable viscosity. A 2116 glass fiber cloth was impregnated with the resulting resin glue solution and was controlled to a suitable weight by a clamp shaft, and was dried in an oven to remove the toluene solvent, and then a 2116 prepreg was obtained. Four sheets of 2116 prepregs were superimposed, with copper foils having a thickness of 1OZ overlaid at the upper and lower surfaces of the superimposed prepregs respectively, and then they were laminated and cured in a press machine in vacuum for 90 min with a curing pressure of 50 kg/cm$^2$ and a curing temperature of 200° C. to obtain a high-frequency circuit substrate. Overall properties of the substrate are shown in Table 2.

Example 2

100.0 parts by weight of methacrylate-modified polyphenylene ether resin powder SA9000, 25.0 parts by weight of vinylphenyl TT organosilicon resin V-1 containing unsaturated double bonds and having a three-dimensional network structure and formed by hydrolytic condensation of trifunctional vinyl-containing siloxane unit (T unit) and 3.0 parts by weight of a free radical initiator dicumyl peroxide (DCP) were dissolved in a toluene solvent and the solution was adjusted to a suitable viscosity. A 2116 glass fiber cloth was impregnated with the resulting resin glue solution and was controlled to a suitable weight by a clamp shaft, and was dried in an oven to remove the toluene solvent, and then a 2116 prepreg was obtained. Four sheets of 2116 prepregs were superimposed, with copper foils having a thickness of 1OZ overlaid at the upper and lower surfaces of the superimposed prepregs respectively, and then they were laminated and cured in a press machine in vacuum for 90 min with a curing pressure of 50 kg/cm$^2$ and a curing temperature of 200° C. to obtain a high-frequency circuit substrate. Overall properties of the substrate are shown in Table 2.

Example 3

100.0 parts by weight of methacrylate-modified polyphenylene ether resin powder SA9000, 30.0 parts by weight of vinylphenyl TT organosilicon resin V-1 containing unsaturated double bonds and having a three-dimensional network structure and formed by hydrolytic condensation of trifunctional vinyl-containing siloxane unit (T unit) and 3.0 parts by weight of a free radical initiator dicumyl peroxide (DCP) were dissolved in a toluene solvent and the solution was adjusted to a suitable viscosity. A 2116 glass fiber cloth was impregnated with the resulting resin glue solution and was controlled to a suitable weight by a clamp shaft, and was dried in an oven to remove the toluene solvent, and then a 2116 prepreg was obtained. Four sheets of 2116 prepregs were superimposed, with copper foils having a thickness of 1OZ overlaid at the upper and lower surfaces of the superimposed prepregs respectively, and then they were laminated and cured in a press machine in vacuum for 90 min with a curing pressure of 50 kg/cm$^2$ and a curing temperature of 200° C. to obtain a high-frequency circuit substrate. Overall properties of the substrate are shown in Table 2.

Example 4

100.0 parts by weight of methacrylate-modified polyphenylene ether resin powder SA9000, 40.0 parts by weight of vinyl TT organosilicon resin V-1 containing unsaturated double bonds and having a three-dimensional network structure and formed by hydrolytic condensation of trifunctional vinyl-containing siloxane unit (T unit) and 3.0 parts by weight of a free radical initiator dicumyl peroxide (DCP) were dissolved in a toluene solvent and the solution was adjusted to a suitable viscosity. A 2116 glass fiber cloth was impregnated with the resulting resin glue solution and was controlled to a suitable weight by a clamp shaft, and was dried in an oven to remove the toluene solvent, and then a 2116 prepreg was obtained. Four sheets of 2116 prepregs were superimposed, with copper foils having a thickness of 1OZ overlaid at the upper and lower surfaces of the superimposed prepregs respectively, and then they were laminated and cured in a press machine in vacuum for 90 min with a curing pressure of 50 kg/cm² and a curing temperature of 200° C. to obtain a high-frequency circuit substrate. Overall properties of the substrate are shown in Table 2.

Example 5

100.0 parts by weight of methacrylate-modified polyphenylene ether resin powder SA9000, 90.0 parts by weight of vinyl TT organosilicon resin V-1 containing unsaturated double bonds and having a three-dimensional network structure and formed by hydrolytic condensation of trifunctional vinyl-containing siloxane unit (T unit) and 3.0 parts by weight of a free radical initiator dicumyl peroxide (DCP) were dissolved in a toluene solvent and the solution was adjusted to a suitable viscosity. A 2116 glass fiber cloth was impregnated with the resulting resin glue solution and was controlled to a suitable weight by a clamp shaft, and was dried in an oven to remove the toluene solvent, and then a 2116 prepreg was obtained. Four sheets of 2116 prepregs were superimposed, with copper foils having a thickness of 1OZ overlaid at the upper and lower surfaces of the superimposed prepregs respectively, and then they were laminated and cured in a press machine in vacuum for 90 min with a curing pressure of 50 kg/cm² and a curing temperature of 200° C. to obtain a high-frequency circuit substrate. Overall properties of the substrate are shown in Table 2.

Example 6

100.0 parts by weight of styryl-modified polyphenylene ether resin powder St-PPE-1, 10.0 parts by weight of vinyl TT organosilicon resin V-1 containing unsaturated double bonds and having a three-dimensional network structure and formed by hydrolytic condensation of trifunctional vinyl-containing siloxane unit (T unit) and 3.0 parts by weight of a free radical initiator dicumyl peroxide (DCP) were dissolved in a toluene solvent and the solution was adjusted to a suitable viscosity. A 2116 glass fiber cloth was impregnated with the resulting resin glue solution and was controlled to a suitable weight by a clamp shaft, and was dried in an oven to remove the toluene solvent, and then a 2116 prepreg was obtained. Four sheets of 2116 prepregs were superimposed, with copper foils having a thickness of 1OZ overlaid at the upper and lower surfaces of the superimposed prepregs respectively, and then they were laminated and cured in a press machine in vacuum for 90 min with a curing pressure of 50 kg/cm² and a curing temperature of 200° C. to obtain a high-frequency circuit substrate. Overall properties of the substrate are shown in Table 2.

Example 7

100.0 parts by weight of styryl-modified polyphenylene ether resin powder St-PPE-1, 40.0 parts by weight of vinyl TT organosilicon resin V-1 containing unsaturated double bonds and having a three-dimensional network structure and formed by hydrolytic condensation of trifunctional vinyl-containing siloxane unit (T unit) and 3.0 parts by weight of a free radical initiator dicumyl peroxide (DCP) were dissolved in a toluene solvent and the solution was adjusted to a suitable viscosity. A 2116 glass fiber cloth was impregnated with the resulting resin glue solution and was controlled to a suitable weight by a clamp shaft, and was dried in an oven to remove the toluene solvent, and then a 2116 prepreg was obtained. Four sheets of 2116 prepregs were superimposed, with copper foils having a thickness of 1OZ overlaid at the upper and lower surfaces of the superimposed prepregs respectively, and then they were laminated and cured in a press machine in vacuum for 90 min with a curing pressure of 50 kg/cm² and a curing temperature of 2001° C. to obtain a high-frequency circuit substrate. Overall properties of the substrate are shown in Table 2.

Example 8

100.0 parts by weight of styryl-modified polyphenylene ether resin powder St-PPE-1, 90.0 parts by weight of vinyl TT organosilicon resin V-1 containing unsaturated double bonds and having a three-dimensional network structure and formed by hydrolytic condensation of trifunctional vinyl-containing siloxane unit (T unit) and 3.0 parts by weight of a free radical initiator dicumyl peroxide (DCP) were dissolved in a toluene solvent and the solution was adjusted to a suitable viscosity. A 2116 glass fiber cloth was impregnated with the resulting resin glue solution and was controlled to a suitable weight by a clamp shaft, and was dried in an oven to remove the toluene solvent, and then a 2116 prepreg was obtained. Four sheets of 2116 prepregs were superimposed, with copper foils having a thickness of 1OZ overlaid at the upper and lower surfaces of the superimposed prepregs respectively, and then they were laminated and cured in a press machine in vacuum for 90 min with a curing pressure of 50 kg/cm² and a curing temperature of 200° C. to obtain a high-frequency circuit substrate. Overall properties of the substrate are shown in Table 2.

Example 9

100.0 parts by weight of methacrylate-modified polyphenylene ether resin powder SA9000, 40.0 parts by weight of vinyl TT organosilicon resin V-1 containing unsaturated double bonds and having a three-dimensional network structure and formed by hydrolytic condensation of trifunctional vinyl-containing siloxane unit (T unit), 3.0 parts by weight of a free radical initiator dicumyl peroxide (DCP), 60.0 parts by weight of silica powder 525 and 30.0 parts by weight of a bromine-containing flame retardant BT-93W were dissolved and dispersed in a toluene solvent and the solution was adjusted to a suitable viscosity. A 2116 glass fiber cloth was impregnated with the resulting resin glue solution and was controlled to a suitable weight by a clamp shaft, and was dried in an oven to remove the toluene solvent, and then a 2116 prepreg was obtained. Four sheets of 2116 prepregs were superimposed, with copper foils having a thickness of 1OZ overlaid at the upper and lower surfaces of the superimposed prepregs respectively, and then they were laminated and cured in a press machine in vacuum for 90 min with a curing pressure of 50 kg/cm² and a curing temperature of 200° C. to obtain a high-frequency circuit substrate. Overall properties of the substrate are shown in Table 3.

Example 10

100.0 parts by weight of methacrylate-modified polyphenylene ether resin powder SA9000, 40.0 parts by weight of vinyl TQ organosilicon resin V-2 containing unsaturated double bonds and having a three-dimensional network structure and formed by hydrolytic condensation of trifunctional vinyl-containing siloxane unit (T unit) and tetrafunctional siloxane unit (Q unit), 3.0 parts by weight of a free radical initiator dicumyl peroxide (DCP), 60.0 parts by weight of silica powder 525 and 30.0 parts by weight of a bromine-containing flame retardant BT-93W were dissolved and dispersed in a toluene solvent and the solution was adjusted to a suitable viscosity. A 2116 glass fiber cloth was impregnated with the resulting resin glue solution and was controlled to a suitable weight by a clamp shaft, and was dried in an oven to remove the toluene solvent, and then a 2116 prepreg was obtained. Four sheets of 2116 prepregs were superimposed, with copper foils having a thickness of 1OZ overlaid at the upper and lower surfaces of the superimposed prepregs respectively, and then they were laminated and cured in a press machine in vacuum for 90 min with a curing pressure of 50 kg/cm$^2$ and a curing temperature of 200° C. to obtain a high-frequency circuit substrate. Overall properties of the substrate are shown in Table 3.

Example 11

100.0 parts by weight of methacrylate-modified polyphenylene ether resin powder SA9000, 40.0 parts by weight of vinyl TT organosilicon resin V-1 containing unsaturated double bonds and having a three-dimensional network structure and formed by hydrolytic condensation of trifunctional vinyl-containing siloxane unit (T unit), 3.0 parts by weight of a free radical initiator dibenzoyl peroxide (BPO), 60.0 parts by weight of silica powder 525 and 30.0 parts by weight of a bromine-containing flame retardant BT-93W were dissolved and dispersed in a toluene solvent and the solution was adjusted to a suitable viscosity. A 2116 glass fiber cloth was impregnated with the resulting resin glue solution and was controlled to a suitable weight by a clamp shaft, and was dried in an oven to remove the toluene solvent, and then a 2116 prepreg was obtained. Four sheets of 2116 prepregs were superimposed, with copper foils having a thickness of 1OZ overlaid at the upper and lower surfaces of the superimposed prepregs respectively, and then they were laminated and cured in a press machine in vacuum for 90 min with a curing pressure of 50 kg/cm$^2$ and a curing temperature of 200° C. to obtain a high-frequency circuit substrate. Overall properties of the substrate are shown in Table 3.

Example 12

100.0 parts by weight of styryl-modified polyphenylene ether resin powder St-PPE-1, 40.0 parts by weight of vinyl TT organosilicon resin V-1 containing unsaturated double bonds and having a three-dimensional network structure and formed by hydrolytic condensation of trifunctional vinyl-containing siloxane unit (T unit), 3.0 parts by weight of a free radical initiator dicumyl peroxide (DCP), 60.0 parts by weight of silica powder 525 and 30.0 parts by weight of a bromine-containing flame retardant BT-93W were dissolved and dispersed in a toluene solvent and the solution was adjusted to a suitable viscosity. A 2116 glass fiber cloth was impregnated with the resulting resin glue solution and was controlled to a suitable weight by a clamp shaft, and was dried in an oven to remove the toluene solvent, and then a 2116 prepreg was obtained. Four sheets of 2116 prepregs were superimposed, with copper foils having a thickness of 1OZ overlaid at the upper and lower surfaces of the superimposed prepregs respectively, and then they were laminated and cured in a press machine in vacuum for 90 min with a curing pressure of 50 kg/cm$^2$ and a curing temperature of 200° C. to obtain a high-frequency circuit substrate. Overall properties of the substrate are shown in Table 3.

Comparative Example 1

This example is the same as Example 7, except that the vinyl TT organosilicon resin V-1 containing unsaturated double bonds and having a three-dimensional network structure and formed by hydrolytic condensation of trifunctional vinyl-containing siloxane unit (T unit) is replaced with linear organosilicon compound containing unsaturated double bonds RH-Vi306. Overall properties of the obtained substrate are shown in Table 3.

Comparative Example 2

This example is the same as Example 7, except that the vinyl TT organosilicon resin V-1 containing unsaturated double bonds and having a three-dimensional network structure and formed by hydrolytic condensation of trifunctional vinyl-containing siloxane unit (T unit) is replaced with cyclic organosilicon compound containing unsaturated double bonds WD-V4. Overall properties of the obtained substrate are shown in Table 3.

Comparative Example 3

This example is the same as Example 7, except that the vinyl TT organosilicon resin V-1 containing unsaturated double bonds and having a three-dimensional network structure and formed by hydrolytic condensation of trifunctional vinyl-containing siloxane unit (T unit) is replaced with methylphenyl DT organosilicon resin V-00. Overall properties of the obtained substrate are shown in Table 3.

TABLE 2

| Materials and properties | Example 1 | Example 2 | Example 3 | Example 4 | Example 5 | Example 6 | Example 7 | Example 8 |
|---|---|---|---|---|---|---|---|---|
| SA9000 | 100 | 100 | 100 | 100 | 100 | 0 | 0 | 0 |
| St-PPE-1 | 0 | 0 | 0 | 0 | 0 | 100 | 100 | 100 |
| V-1 | 10 | 25 | 30 | 40 | 90 | 10 | 40 | 90 |
| V-2 | 0 | 0 | 0 | 0 | 0 | 0 | 0 | 0 |
| V-00 | 0 | 0 | 0 | 0 | 0 | 0 | 0 | 0 |
| RH-Vi306 | 0 | 0 | 0 | 0 | 0 | 0 | 0 | 0 |
| WD-V4 | 0 | 0 | 0 | 0 | 0 | 0 | 0 | 0 |
| DCP | 3 | 3 | 3 | 3 | 3 | 3 | 3 | 3 |

TABLE 2-continued

| Materials and properties | Example 1 | Example 2 | Example 3 | Example 4 | Example 5 | Example 6 | Example 7 | Example 8 |
|---|---|---|---|---|---|---|---|---|
| BPO | 0 | 0 | 0 | 0 | 0 | 0 | 0 | 0 |
| 525 | 0 | 0 | 0 | 0 | 0 | 0 | 0 | 0 |
| BT-93W | 0 | 0 | 0 | 0 | 0 | 0 | 0 | 0 |
| XP-7866 | 0 | 0 | 0 | 0 | 0 | 0 | 0 | 0 |
| 2116 | 80 | 80 | 80 | 80 | 155 | 155 | 155 | 80 |
| Whether the organosilicon resin crosslinking agent is volatile | No | No | No | No | No | No | No | No |
| Glass transition temperature (° C.) | 180.0 | 190.0 | 210.0 | 210.0 | 210.0 | 200.0 | 210.0 | 210.0 |
| Thermal decomposition temperature (° C.) | 450.0 | 450.0 | 460.0 | 460.0 | 460.0 | 455.0 | 465.0 | 465.0 |
| Solder dipping resistance 288° C. (s) | >300 | >300 | >300 | >300 | >300 | >300 | >300 | >300 |
| Water absorption (%) | 0.08 | 0.08 | 0.08 | 0.08 | 0.08 | 0.08 | 0.08 | 0.07 |
| Interlayer adhesive force (N/mm) | 1.06-2.21 | 1.02-2.10 | 1.01-2.20 | 1.26-2.25 | 1.15-1.99 | 1.14-2.06 | 1.13-1.98 | 1.45-1.95 |
| Bending strength (MPa) | 456 | 456 | 460 | 460 | 460 | 450 | 465 | 465 |
| Dielectric constant (10 GHz) | 3.65 | 3.65 | 3.65 | 3.65 | 3.65 | 3.65 | 3.65 | 3.65 |
| Dielectric loss (10 GHz) | 0.0070 | 0.0065 | 0.006 | 0.0055 | 0.0045 | 0.0070 | 0.0055 | 0.0045 |

TABLE 3

| Materials and properties | Example 9 | Example 10 | Example 11 | Example 12 | Comparative Example 1 | Comparative Example 2 | Comparative Example 3 |
|---|---|---|---|---|---|---|---|
| SA9000 | 100 | 100 | 100 | 0 | 100 | 100 | 100 |
| St-PPE-1 | 0 | 0 | 0 | 100 | 0 | 0 | 0 |
| V-1 | 40 | 0 | 40 | 40 | 0 | 0 | 0 |
| V-2 | 0 | 40 | 0 | 0 | 0 | 0 | 0 |
| V-00 | 0 | 0 | 0 | 0 | 0 | 0 | 40 |
| RH-Vi306 | 0 | 0 | 0 | 0 | 40 | 0 | 0 |
| WD-V4 | 0 | 0 | 0 | 0 | 0 | 40 | 0 |
| DCP | 3 | 3 | 0 | 3 | 3 | 3 | 3 |
| BPO | 0 | 0 | 3 | 0 | 0 | 0 | 0 |
| 525 | 60 | 60 | 60 | 60 | 60 | 60 | 60 |
| BT-93W | 30 | 30 | 0 | 0 | 30 | 30 | 30 |
| XP-7866 | 0 | 0 | 30 | 30 | 0 | 0 | 0 |
| 2116 | 155 | 155 | 155 | 155 | 155 | 155 | 155 |
| Whether the organosilicon resin crosslinking agent is volatile | No | No | No | No | No | Yes | No |

TABLE 3-continued

| Materials and properties | Example 9 | Example 10 | Example 11 | Example 12 | Comparative Example 1 | Comparative Example 2 | Comparative Example 3 |
|---|---|---|---|---|---|---|---|
| Glass transition temperature (° C.) | 210.0 | 210.0 | 210.0 | 210.0 | 210.0 | 210.0 | 160.0 |
| Thermal decomposition temperature (° C.) | 430.0 | 430.0 | 430.0 | 435.0 | 430.0 | 430.0 | 380.0 |
| Solder dipping resistance 288° C. (s) | >300 | >300 | >300 | >300 | >300 | >300 | 1 |
| Water absorption (%) | 0.08 | 0.08 | 0.08 | 0.08 | 0.08 | 0.08 | 0.10 |
| Interlayer adhesive force (N/mm) | 1.26-2.25 | 1.26-2.25 | 1.26-2.25 | 1.13-1.98 | 1.26-2.25 | 1.26-2.25 | 0.2-0.5 |
| Bending strength (MPa) | 460 | 460 | 460 | 465 | 340 | 460 | 100 |
| Dielectric constant (10 GHz) | 3.85 | 3.85 | 3.85 | 3.85 | 3.85 | 3.90 | 3.90 |
| Dielectric loss (10 GHz) | 0.0055 | 0.0055 | 0.0055 | 0.0055 | 0.0055 | 0.0065 | 0.0070 |

As can be seen from comparisons of Comparative Example 1 with Example 9 and Example 10, the high-frequency circuit substrate prepared by using an organosilicon resin containing unsaturated double bonds and having a three-dimensional network structure as a crosslinking agent has a higher blending strength compared to that prepared by using linear organosilicon compound RH-Vi306 containing unsaturated double bonds as a crosslinking agent. As can be seen from comparisons of Comparative Example 2 with Example 9 and Example 10, the organosilicon resin containing unsaturated double bonds and having a three-dimensional network structure as a crosslinking agent does not have problem of volatilization during the sizing and baking process, compared to cyclic organosilicon compound WD-V4 containing unsaturated double bonds. The high-frequency circuit substrate prepared by using an organosilicon resin containing unsaturated double bonds and having a three-dimensional network structure as a crosslinking agent has high glass transition temperature, high thermal decomposition temperature, low water absorption, high interlayer adhesion, high bending strength, low dielectric constant and low dielectric loss. Therefore, the organosilicon resin containing unsaturated double bonds and having a three-dimensional network structure is a crosslinking agent with excellent overall properties, and thus can be used in the preparation of high-frequency circuit substrates.

As can be seen from comparisons of Comparative Example 3 with Example 9 and Example 10, since methyl-phenyl DT organosilicon resin does not contain active vinyl groups, it cannot make a vinyl-modified thermosetting polyphenylene ether cured, and thus the prepared substrate has poor overall properties such as glass transition temperature, solder dipping resistance, interlayer adhesive force, bending strength, which cannot meet requirements on overall properties of high-frequency electronic circuit substrates by the terminals.

Example 13

100.0 parts by weight of methacrylate-modified polyphenylene ether resin, 40.0 parts by weight of vinyl TT organosilicon resin containing unsaturated double bonds and having a three-dimensional network structure and formed by hydrolytic condensation of trifunctional vinyl-containing siloxane unit (T unit), 3.0 parts by weight of a free radical initiator butyl 4,4-di(tert-butylperoxy)valerate, 50.0 parts by weight of silicon carbide and 40.0 parts by weight of a flame retardant tris(2,6-dimethylphenyl)phosphine were dissolved in a mixed solvent of toluene and butanone and the solution was adjusted to a suitable viscosity to obtain a resin glue solution. 120.0 parts by weight of 7628 glass fiber cloth was impregnated with the resin glue solution and was controlled to a suitable weight by a clamp shaft, and was dried in an oven to remove solvent, and then a 7628 prepreg was obtained. Four sheets of 7628 prepregs were superimposed, with copper foils having a thickness of 1OZ overlaid at the upper and lower surfaces of the superimposed prepregs respectively, and then they were laminated and cured in a press machine in vacuum for 90 min with a curing pressure of 50 kg/cm² and a curing temperature of 200° C. to obtain a high-frequency circuit substrate.

The methacrylate-modified polyphenylene ether has a structural formula of:

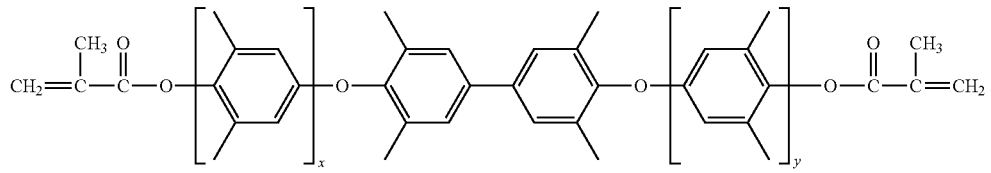

wherein 15<x<50, 15<y<50, 15<x+y<100; and the molecular weight of the methacrylate-modified polyphenylene ether is 8000 g/mol.

The organosilicon resin containing unsaturated double bonds and having a three-dimensional network structure is a TT organosilicon resin containing unsaturated double bonds and having a three-dimensional network structure and formed by hydrolytic condensation of trifunctional siloxane unit (T unit) which has a structural formula of:

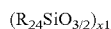
$(R_{24}SiO_{3/2})_{x1}$ wherein x1=6; and $R_{24}$ is selected from substituted or unsubstituted C2-C10 C=C-containing groups.

Example 14

100.0 parts by weight of methacrylate-modified polyphenylene ether resin, 40.0 parts by weight of vinyl TT organosilicon resin containing unsaturated double bonds and having a three-dimensional network structure and formed by hydrolytic condensation of trifunctional vinyl-containing siloxane unit (T unit), 1.5 parts by weight of a free radical initiator dibenzoyl peroxide (BPO), 125.0 parts by weight of aluminum nitride and 25.0 parts by weight of decabromodiphenyl ether were dissolved and dispersed in a toluene solvent and the solution was adjusted to a suitable viscosity. An emulsifier was used for emulsification, so that the powder filler and the flame retardant and others were uniformly dispersed in the mixed solution to obtain a resin glue solution. 500.0 parts by weight of 2116 glass fiber cloth was impregnated with the resin glue solution and was controlled to a suitable weight by a clamp shaft, and was dried in an oven to remove toluene solvent, and then a 2116 prepreg was obtained. Four sheets of 2116 prepregs were superimposed, with copper foils having a thickness of 1OOZ overlaid at the upper and lower surfaces of the superimposed prepregs respectively, and then they were laminated and cured in a press machine in vacuum for 90 min with a curing pressure of 50 kg/cm² and a curing temperature of 200° C. to obtain a high-frequency circuit substrate.

The methacrylate-modified polyphenylene ether has a structural formula of:

50<x<100, and the molecular weight of the methacrylate-modified polyphenylene ether resin is 8000 g/mol.

The organosilicon resin containing unsaturated double bonds and having a three-dimensional network structure is a TT organosilicon resin containing unsaturated double bonds and having a three-dimensional network structure and formed by hydrolytic condensation of trifunctional siloxane unit (T unit) which has a structural formula of:

$(R_{24}SiO_{3/2})_{x1}$ wherein x1=8; and $R_{24}$ is selected from substituted or unsubstituted C2-C10 C=C-containing groups.

Example 15

100.0 parts by weight of styryl-modified polyphenylene ether resin, 50.0 parts by weight of vinyl TT organosilicon resin containing unsaturated double bonds and having a three-dimensional network structure and formed by hydrolytic condensation trifunctional vinyl-containing siloxane unit (T unit), 1.0 parts by weight of a free radical initiator dibenzoyl peroxide (BPO), 100.0 parts by weight of alumina and 30.0 parts by weight of decabromodiphenyl ether were dissolved in a toluene solvent and the solution was adjusted to a suitable viscosity. An emulsifier was used for emulsification, so that the powder filler and the flame retardant were uniformly dispersed in the mixed solution to obtain a resin glue solution. 230.0 parts by weight of 2116 glass fiber cloth was impregnated with the resin glue solution and was controlled to a suitable weight by a clamp shaft, and was dried in an oven to remove toluene solvent, and then a 2116 prepreg was obtained. Four sheets of 2116 prepregs were superimposed, with copper foils having a thickness of 1OZ overlaid at the upper and lower surfaces of the superimposed prepregs respectively, and then they were laminated and cured in a press machine in vacuum for 120 min with a curing pressure of 40 kg/cm² and a curing temperature of 180° C. to obtain a high-frequency circuit substrate.

The styryl-modified polyphenylene ether resin has a structural formula of:

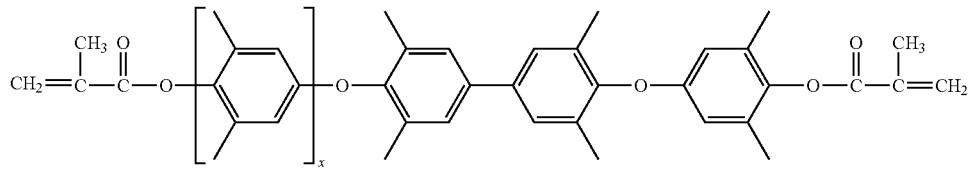

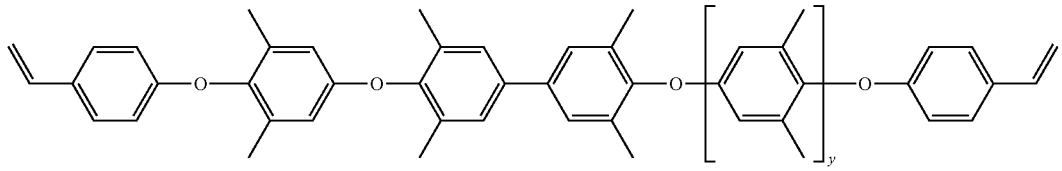

5<y<15, and the molecular weight of the styryl-modified polyphenylene ether resin is 1000 g/mol.

The organosilicon resin containing unsaturated double bonds and having a three-dimensional network structure is a TT organosilicon resin containing unsaturated double bonds and having a three-dimensional network structure and formed by hydrolytic condensation of trifunctional siloxane unit (T unit) which has a structural formula of:

$$(R_{24}SiO_{3/2})_{x1}$$

wherein x1=10; and $R_{24}$ is selected from substituted or unsubstituted C2-C10 C=C-containing groups.

Example 16

100.0 parts by weight of styryl-modified polyphenylene ether resin, 50.0 parts by weight of vinyl TQ organosilicon resin containing unsaturated double bonds and having a three-dimensional network structure and formed by hydrolytic condensation of trifunctional vinyl-containing siloxane unit (T unit) and tetrafunctional siloxane unit (Q unit), 1.5 parts by weight of a free radical initiator dibenzoyl peroxide (BPO), 125.0 parts by weight of boron nitride and 25.0 parts by weight of decabromodiphenyl ether were dissolved in a toluene solvent and the solution was adjusted to a suitable viscosity. An emulsifier was used for emulsification, so that the powder filler and the flame retardant were uniformly dispersed in the mixed solution to obtain a resin glue solution. 450.0 parts by weight of 2116 glass fiber cloth was impregnated with the resin glue solution and was controlled to a suitable weight by a clamp shaft, and was dried in an oven to remove toluene solvent, and then a 2116 prepreg was obtained. Four sheets of 2116 prepregs were superimposed, with copper foils having a thickness of 1OZ overlaid at the upper and lower surfaces of the superimposed prepregs respectively, and then they were laminated and cured in a press machine in vacuum for 70 min with a curing pressure of 60 kg/cm² and a curing temperature of 220° C. to obtain a high-frequency circuit substrate.

The styryl-modified polyphenylene ether resin has a structural formula of:

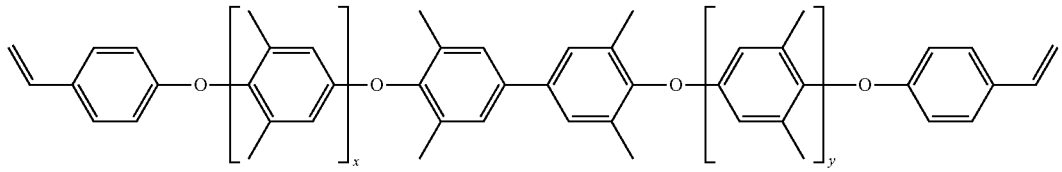

50<x<60, 25<y<45, 75<x+y<100, and the molecular weight of the styryl-modified polyphenylene ether resin is 9500 g/mol.

The TQ organosilicon resin containing unsaturated double bonds and having a three-dimensional network structure and formed by hydrolytic condensation of trifunctional vinyl-containing siloxane unit (T unit) and tetrafunctional siloxane unit (Q unit) has a structural formula of:

$$(R_{25}SiO_{3/2})_{y1}(SiO_{4/2})_{z1}$$

wherein y1=10, z1=2, and y1/z1=5; and $R_2$ is selected from substituted or unsubstituted C2-C10 C=C-containing groups.

Table 4 shows test results of performances of high-frequency circuit substrates of Examples 13-16.

TABLE 4

| Performances | Example 13 | Example 14 | Example 15 | Example 16 |
|---|---|---|---|---|
| Glass transition temperature (° C.) | 205.0 | 210.0 | 215.0 | 225.0 |
| Thermal decomposition temperature (° C.) | 450.0 | 430. | 435.0 | 435.0 |
| Solder dipping resistance 288° C.(s) | >300 | >300 | >300 | >300 |
| Water absorption (%) | 0.08 | 0.08 | 0.08 | 0.08 |
| Interlayer adhesive force (N/mm) | 1.06-1.98 | 1.11-1.90 | 1.27-2.12 | 0.09-1.61 |
| Dielectric constant (10 GHz) | 3.85 | 3.90 | 4.10 | 3.95 |
| Dielectric loss tangent (10 GHz) | 0.0055 | 0.0056 | 0.0053 | 0.0055 |

The applicant states that: the present invention illustrates detailed methods of the present invention by the above examples, but the present invention is not limited to the above detailed methods, that is to say, it does not mean that the present invention must be conducted relying on the above detailed methods. Those skilled in the art should understand that any modification to the present invention, any equivalent replacement of each raw material of the products of the present invention and the additions of auxiliary ingredients, the selections of specific embodiments and the like all fall into the protection scope and the disclosure scope of the present invention.

The invention claimed is:

1. A polyphenylene ether resin composition, comprising a vinyl-modified polyphenylene ether resin and an organosilicon resin containing unsaturated double bonds and having a three-dimensional network structure; the organosilicon resin containing unsaturated double bonds and having a three-dimensional network structure comprises at least one member selected from the group consisting of TT organosilicon resin containing unsaturated double bonds and having a three-dimensional network structure and formed by hydrolytic condensation of trifunctional siloxane unit (T unit), and TQ organosilicon resin containing unsaturated double bonds and having a three-dimensional network structure and formed by hydrolytic condensation of trifunctional siloxane unit (T unit) and tetrafunctional siloxane unit (Q unit);

wherein the TQ organosilicon resin containing unsaturated double bonds and having a three-dimensional network structure and formed by hydrolytic condensation of trifunctional siloxane unit (T unit) and tetrafunctional siloxane unit (Q unit) has the following structure:

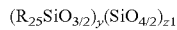

$(R_{25}SiO_{3/2})_{y1}(SiO_{4/2})_{z1}$ wherein $4 \leq y1 \leq 100$, $1 \leq z1 \leq 100$, and $4 \leq y1/z1 \leq 10$;

$R_{25}$ is selected from substituted or unsubstituted C2-C10 C=C-containing groups.

2. The polyphenylene ether resin composition of claim 1, wherein the vinyl-modified polyphenylene ether resin has the following structure:

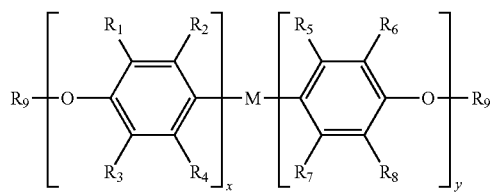

wherein $0 \leq x \leq 100$, $0 \leq y \leq 100$, $2 \leq x+y \leq 100$;

M is selected from:

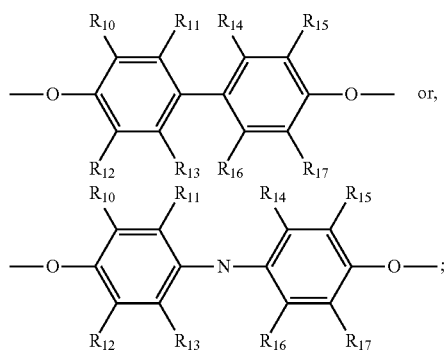

N comprises at least one member selected from the group consisting of —O—, —CO—, —SO—, —SC—, —SO$_2$— and —C(CH$_3$)$_2$—;

$R_2$, $R_4$, $R_6$, $R_8$, $R_{11}$, $R_{13}$, $R_{15}$ and $R_{17}$ are each independently selected from the group consisting of substituted or unsubstituted C1-C8 linear alkyl, substituted or unsubstituted C1-C8 branched alkyl, and substituted or unsubstituted phenyl, or a combination of at least two of them;

$R_1$, $R_3$, $R_5$, $R_7$, $R_{10}$, $R_{12}$, $R_{14}$ and $R_{16}$ are each independently selected from the group consisting of hydrogen atom, substituted or unsubstituted C1-C8 linear alkyl, substituted or unsubstituted C1-C8 branched alkyl, and substituted or unsubstituted phenyl, or a combination of at least two of them;

$R_9$ is selected from

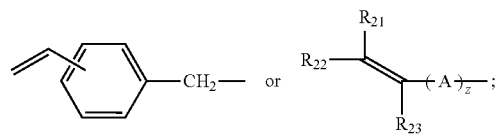

wherein A is arylene, carbonyl, or alkylene having 1-10 carbon atoms; Z is an integer of 0-10;

$R_{21}$, $R_{22}$ and $R_{23}$ are each independently selected from hydrogen atom or alkyl having 1-10 carbon atoms.

3. The polyphenylene ether resin composition of claim 1, wherein the vinyl-modified polyphenylene ether resin has a number average molecular weight of 500-10,000 g/mol.

4. The polyphenylene ether resin composition of claim 1, wherein the TT organosilicon resin containing unsaturated double bonds and having a three-dimensional network structure and formed by hydrolytic condensation of trifunctional siloxane unit (T unit) has the following structure:

$(R_{24}SiO_{3/2})_{x1}$ wherein $6 \leq x1 \leq 10$;

$R_{24}$ is selected from substituted or unsubstituted C2-C10 C=C-containing groups.

5. The polyphenylene ether resin composition of claim 1, wherein the weight of the organosilicon resin containing unsaturated double bonds and having a three-dimensional network structure is 10-90 parts by weight, based on 100 parts by weight of the vinyl-modified polyphenylene ether resin.

6. The polyphenylene ether resin composition of claim 1, wherein the polyphenylene ether resin composition further comprises a free radical initiator.

7. The polyphenylene ether resin composition of claim 6, wherein the weight of the free radical initiator is 1-3 parts by weight, based on 100 parts by weight of the total weight of the vinyl-modified polyphenylene ether resin and the organosilicon resin containing unsaturated double bonds and having a three-dimensional network structure.

8. The polyphenylene ether resin composition of claim 6, wherein the free radical initiator is selected from organic peroxide initiators.

9. The polyphenylene ether resin composition of claim 6, wherein the free radical initiator comprises at least one member selected from the group consisting of dicumyl peroxide, dibenzoyl peroxide, tert-butyl peroxybenzoate and butyl 4,4-di(tert-butylperoxy)valerate.

10. The polyphenylene ether resin composition of claim 1, wherein the polyphenylene ether resin composition further comprises a flame retardant.

11. The polyphenylene ether resin composition of claim 1, wherein based on 100 parts by weight of the total weight of the vinyl-modified polyphenylene ether resin and the organosilicon resin containing unsaturated double bonds and having a three-dimensional network structure, the weight of the flame retardant is 0-40 parts by weight.

12. The polyphenylene ether resin composition of claim 1, wherein the flame retardant comprises at least one member selected from the group consisting of halogenated flame retardant, phosphorus flame retardant, and nitrogen flame retardant.

13. The polyphenylene ether resin composition of claim 1, wherein the flame retardant comprises at least one member selected from the group consisting of brominated flame retardant, phosphorus flame retardant and nitrogen flame retardant.

14. The polyphenylene ether resin composition of claim 13, wherein the brominated flame retardant comprises at least one member selected from the group consisting of decabromodiphenyl oxide, hexabromobenzene, decabromodiphenyl ethane, and ethylene bis(tetrabromophthalimide);

the phosphorus flame retardant comprises at least one member selected from the group consisting of tris(2,6-dimethylphenyl)phosphine, 10-(2,5-dihydroxyphenyl)-9,10-dihydro-9-oxa-10-phosphaphenanthrene-10-oxide, 2,6-bis(2,6-dimethylphenyl)phosphinobenzene and 10-phenyl-9,10-dihydro-9-oxa-10-phosphaphenanthrene-10-oxide;

the nitrogen flame retardant comprises at least one member selected from the group consisting of melamine, melamine phosphate, guanidine phosphate, guanidine carbonate and guanidine sulfamate.

15. The polyphenylene ether resin composition of claim 1, wherein the polyphenylene ether resin composition further comprises a powder filler.

16. The polyphenylene ether resin composition of claim 15, wherein the powder filler comprises at least one member selected from the group consisting of crystalline silica, amorphous silica, spherical silica, fused silica, titania, silicon carbide, glass fiber, alumina, aluminum nitride, boron nitride, barium titanate and strontium titanate.

17. The polyphenylene ether resin composition of claim 15, wherein the weight of the powder filler is 0-150 parts by weight, based on 100 parts by weight of the total weight of the vinyl-modified polyphenylene ether resin, the organosilicon resin containing unsaturated double bonds and having a three-dimensional network structure and the flame retardant.

18. A resin glue solution obtained by dissolving or dispersing the polyphenylene ether resin composition of claim 1 in a solvent.

19. A prepreg prepared by impregnating a reinforcing material with the resin glue solution of claim 18 and then drying it.

20. The prepreg of claim 19, wherein the weight of the reinforcing material is 50-230 parts by weight, based on 100 parts by weight of the total weight of the vinyl-modified polyphenylene ether resin, the organosilicon resin containing unsaturated double bonds and having a three-dimensional network structure, the flame retardant and the powder filler.

21. A high-frequency circuit substrate prepared from at least one sheet of the prepreg of claim 19.

* * * * *